(12) United States Patent
Itou et al.

(10) Patent No.: US 12,028,970 B2
(45) Date of Patent: Jul. 2, 2024

(54) WIRING BOARD, ELECTRONIC DEVICE, AND ELECTRONIC MODULE

(71) Applicant: KYOCERA Corporation, Kyoto (JP)

(72) Inventors: Seiichirou Itou, Kyoto (JP); Reika Nishiuchi, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 273 days.

(21) Appl. No.: 17/605,081

(22) PCT Filed: Apr. 22, 2020

(86) PCT No.: PCT/JP2020/017306
§ 371 (c)(1),
(2) Date: Oct. 20, 2021

(87) PCT Pub. No.: WO2020/218326
PCT Pub. Date: Oct. 29, 2020

(65) Prior Publication Data
US 2022/0192013 A1     Jun. 16, 2022

(30) Foreign Application Priority Data

Apr. 23, 2019  (JP) .................................. 2019-081591
Apr. 23, 2019  (JP) .................................. 2019-081602

(51) Int. Cl.
| H05K 1/02 | (2006.01) |
| H05K 1/18 | (2006.01) |
| G01P 15/08 | (2006.01) |
| G01P 15/18 | (2013.01) |

(52) U.S. Cl.
CPC ......... *H05K 1/0284* (2013.01); *H05K 1/0296* (2013.01); *H05K 1/181* (2013.01); *G01P 15/08* (2013.01); *G01P 15/18* (2013.01)

(58) Field of Classification Search
CPC .... H05K 1/0284; H05K 1/0296; H05K 1/181; G01P 15/08; G01P 15/18
See application file for complete search history.

(56) References Cited

U.S. PATENT DOCUMENTS

| 5,003,693 | A | * | 4/1991 | Atkinson ............ B29C 45/1418 |
| | | | | 29/849 |
| 5,178,976 | A | * | 1/1993 | Rose .................... H05K 3/0002 |
| | | | | 430/318 |
| 5,241,450 | A | * | 8/1993 | Bernhardt ........... H01L 23/5385 |
| | | | | 361/689 |

(Continued)

FOREIGN PATENT DOCUMENTS

| JP | 2001-102746 A | 4/2001 |
| JP | 2001-156422 A | 6/2001 |

(Continued)

*Primary Examiner* — Michael A Matey
(74) *Attorney, Agent, or Firm* — Volpe Koenig

(57) ABSTRACT

Disclosed is a wiring board, including: a base body having insulating properties; and a wiring conductor positioned on the base body. The base body has a first surface, a fourth surface positioned opposite to the first surface, and a second surface and a third surface positioned at side surfaces between the first surface and the fourth surface. The first surface, the second surface, and the third surface are mounting surfaces for respective electronic components, and the fourth surface is an installation surface.

16 Claims, 9 Drawing Sheets

(56) References Cited

U.S. PATENT DOCUMENTS

| | | | | |
|---|---|---|---|---|
| 5,545,924 | A * | 8/1996 | Contolatis | H05K 1/0243 |
| | | | | 257/E25.013 |
| 6,011,684 | A * | 1/2000 | Devoe | H01G 4/38 |
| | | | | 361/321.1 |
| 2007/0062727 | A1* | 3/2007 | Braman | H05K 3/3405 |
| | | | | 174/261 |
| 2009/0091892 | A1* | 4/2009 | Otsuka | H05K 7/14324 |
| | | | | 361/715 |
| 2009/0308157 | A1* | 12/2009 | Eriksen | G01C 21/166 |
| | | | | 228/208 |
| 2019/0313522 | A1* | 10/2019 | Trulli | H01L 23/367 |
| 2020/0381168 | A1* | 12/2020 | Yokoyama | H01F 27/324 |

FOREIGN PATENT DOCUMENTS

| | | | |
|---|---|---|---|
| JP | 2003-028646 | A | 1/2003 |
| JP | 2004-247699 | A | 9/2004 |
| JP | 2008-185343 | A | 8/2008 |
| JP | 2016-051709 | A | 4/2016 |

* cited by examiner

WIRING BOARD, ELECTRONIC DEVICE, AND ELECTRONIC MODULE

TECHNICAL FIELD

The present disclosure relates to a wiring board, an electronic device, and an electronic module.

BACKGROUND

Conventionally, there is a multi-axis sensor that performs detection in a plurality of directions, such as an acceleration sensor or an angular velocity sensor. Japanese Patent Application Publication No. 2008-185343 discloses a gyro module that combines a gyro element piece having one detection axis, and a gyro element piece having two detection axes.

SUMMARY

A wiring board according to the present disclosure is provided with:
- a base body having insulating properties; and
- a wiring conductor positioned on the base body, in which
  the base body has a first surface, a fourth surface positioned opposite to the first surface, and a second surface and a third surface positioned at side surfaces between the first surface and the fourth surface,
  the first surface, the second surface, and the third surface are mounting surfaces for respective electronic components, and
  the fourth surface is an installation surface.

An electronic device according to the present disclosure includes
- the wiring board described above; and
- electronic components respectively mounted to the first surface, the second surface, and the third surface.

An electronic module according to the present disclosure includes
- the electronic device described above; and
- a module board to which the electronic device has been mounted.

DETAILED DESCRIPTION

With reference to the drawings, description is given in detail below regarding a first embodiment of the present disclosure.

First Embodiment

A base body of a wiring board in the present disclosure has a first surface, a fourth surface positioned opposite the first surface, and a second surface and a third surface that are positioned between the first surface and the fourth surface. The first surface, the second surface, and the third surface are mounting surfaces for respective electronic components, and the fourth surface is an installation surface. It is sufficient if the base body of the wiring board in the present disclosure satisfies at least the configuration described above, and the overall shape of the base body may be a cube or a rectangular parallelepiped, for example. Using the drawings, description is given below based on an example in which the shape of the base body is a convex polyhedron shape.

Figure 1:
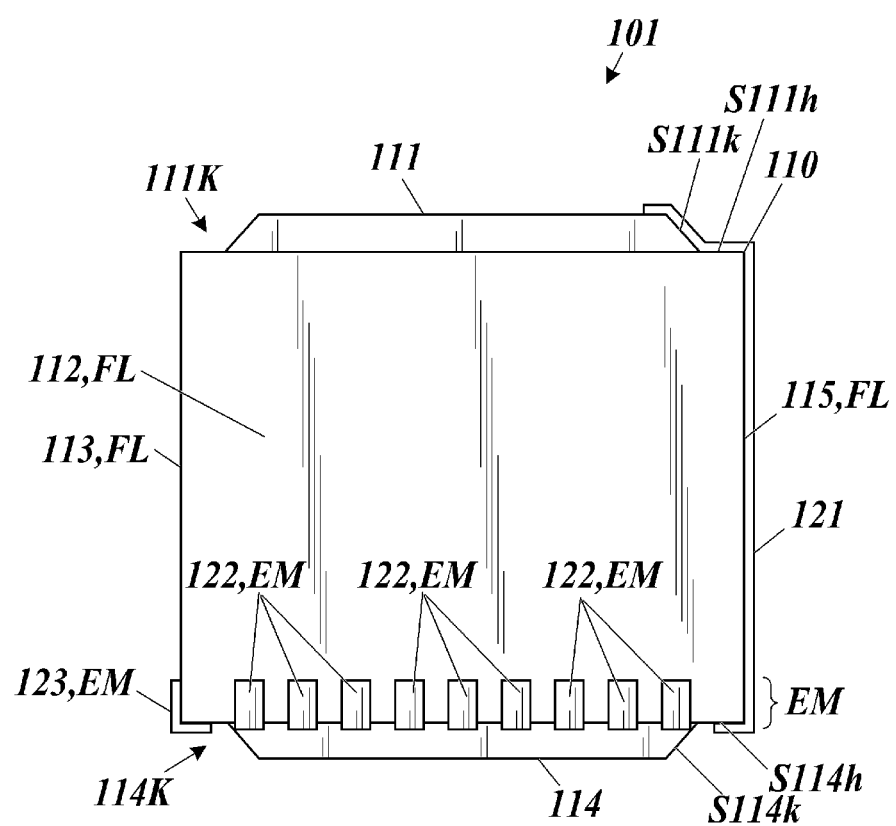
FIG. 1 is a front view that illustrates a wiring board according to a first embodiment of the present disclosure.
Figure 2A:
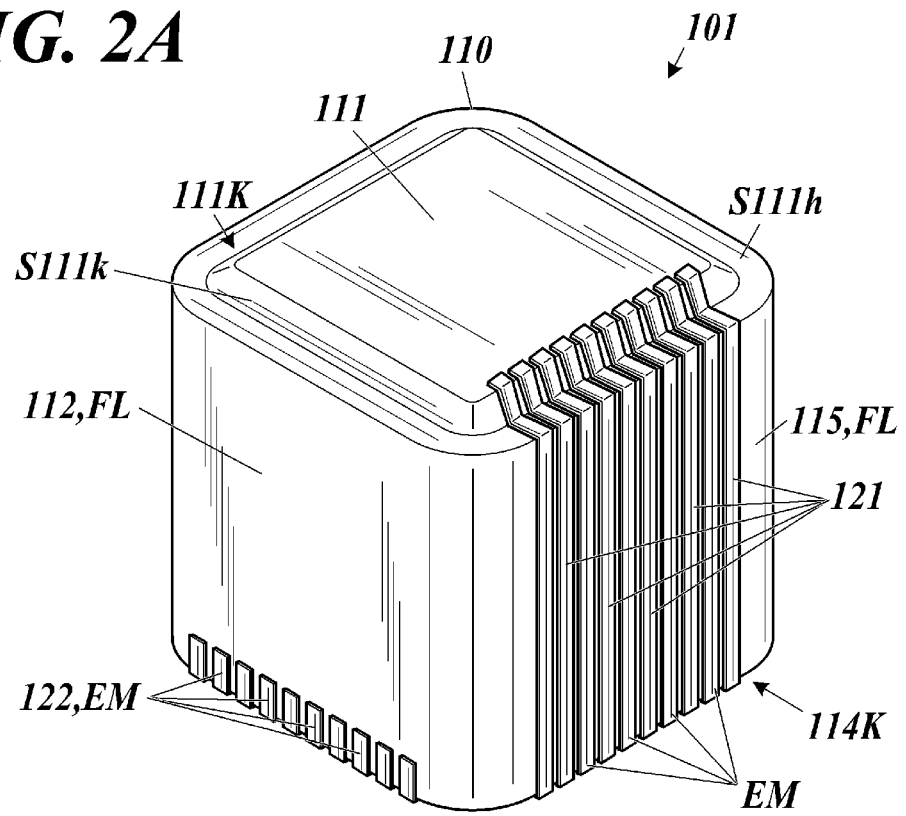
FIG. 2A is a perspective view illustrating the wiring board of FIG. 1.
Figure 2B:
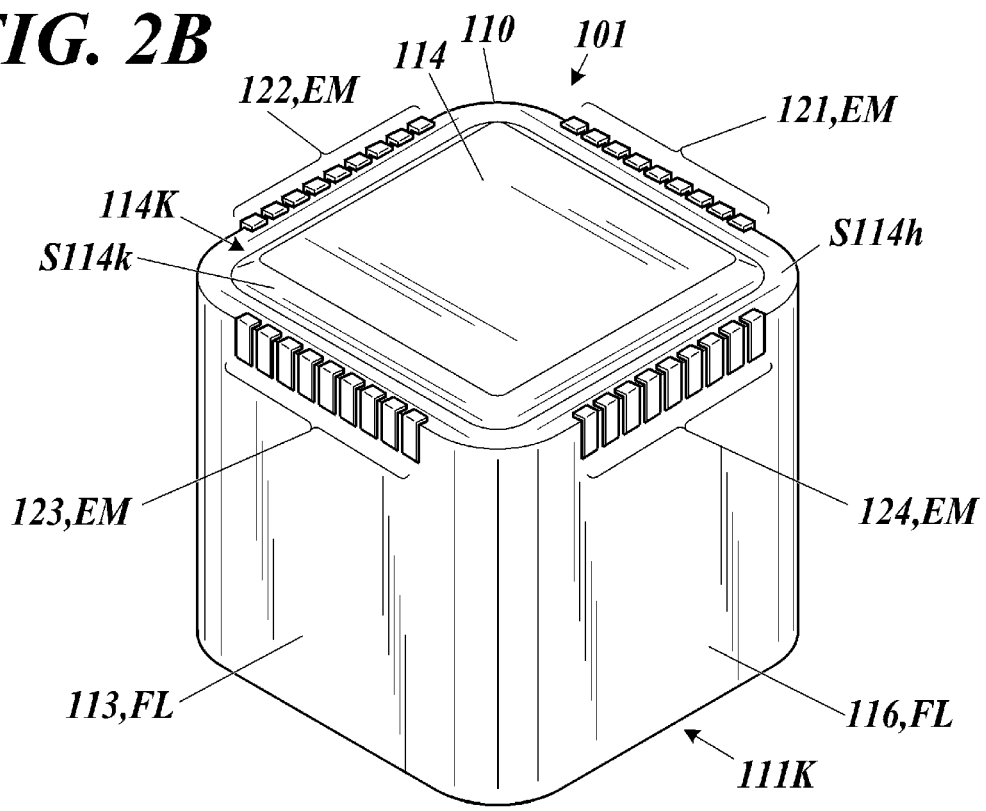
FIG. 2B is a perspective view in which the wiring board of FIG. 1 is seen from a back side.
Figure 3:
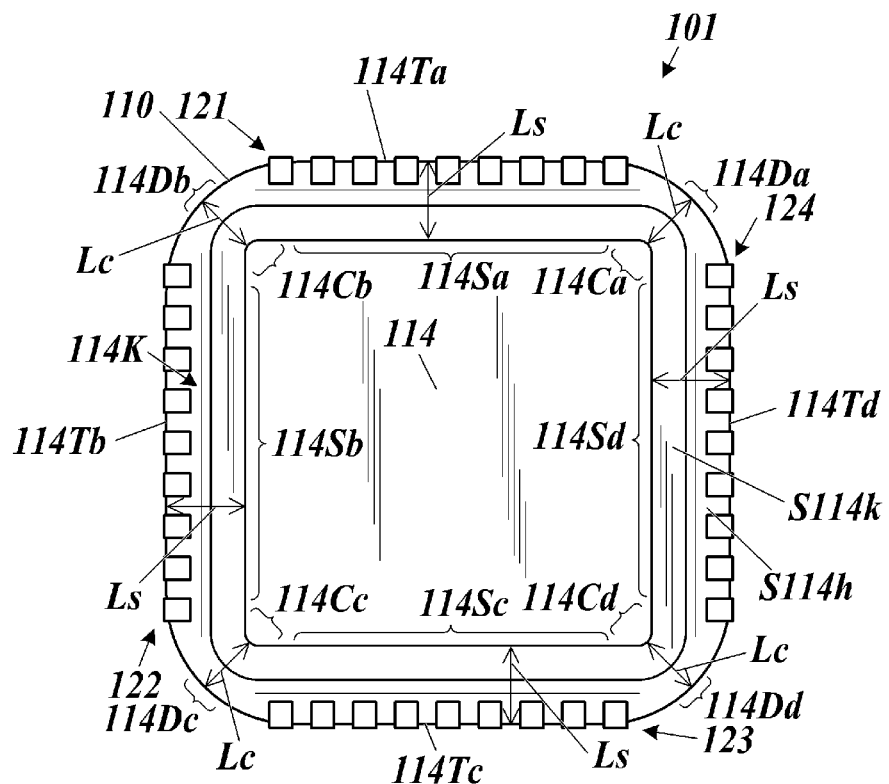
FIG. 3 is a bottom view of the wiring board of FIG. 1.

FIG. 1 is a front view that illustrates a wiring board according to a first embodiment of the present disclosure. FIG. 2A is a perspective view illustrating the wiring board of FIG. 1. FIG. 2B is a perspective view in which the wiring board of FIG. 1 is seen from a back side. FIG. 3 is a bottom view of the wiring board of FIG. 1.

A wiring board 101 of the first embodiment is provided with a base body 110 having insulating properties, and wiring conductors 121 to 124 positioned on the base body 110. At least some of the wiring conductors 121 to 124 are positioned on the surface of the base body 110.

The base body 110 has a convex polyhedron shape. The convex polyhedron shape is not limited to a strict convex polyhedron defined in geometry, and implies forms that include fine structures such as rounding, notches or protrusions at corners of a convex polyhedron, and forms that include fine structures such as grooves, holes, or protrusions on planes of a convex polyhedron. In other words, the convex polyhedron shape may be a shape that includes fine differences from a strict convex polyhedron if, by setting respective planes of a solid as mounting surfaces for a plurality of electronic components as well as an installation surface with respect to a module board or the like, relative angles between a board surface of the module board and the plurality of electronic components are in a range that do not inhibit functionality determined in accordance with relative angles between respective surfaces of the convex polyhedron.

The base body 110 has a first surface 111, a second surface 112, and third surface 113 which are to be mounted with electronic components, and a fourth surface 114 positioned opposite to the first surface 111. The second surface 112 and the third surface 113 are positioned at side surfaces FL between the first surface 111 and the fourth surface 114. The fourth surface 114 functions as an installation surface which is adhered via a joining material to a module board (for example, a module board 210 in FIG. 6). Furthermore, the base body 110 has a sixth surface 116 which is opposite to the second surface 112. The base body 110 also has a fifth surface 115 which is opposite to the third surface 113. The first surface 111 to the sixth surface 116 may be planar.

Rounding or a notch may be provided at the periphery of the first surface 111 to the sixth surface 116. The first surface 111, the second surface 112, and the third surface 113 which are to be mounted with electronic components, even if not planar, may have the same surface condition as when the electronic components are mounted to a flat surface. In addition, the fourth surface 114 which is an installation surface may also, when installed on a module board, have the same surface condition as when the fourth surface 114 is a flat surface.

The first surface 111, the second surface 112, and the third surface 113 to which electronic components are to be mounted have relative angles that are mutually orthogonal. It may be that the first surface 111 is parallel to the fourth surface 114, the second surface 112 is parallel to the sixth surface 116, and the third surface 113 is parallel to the fifth surface 115.

The base body 110 may have a recess 114K recessed from the fourth surface 114, at the perimeter of the fourth surface 114. The recess 114K is provided at the entire perimeter of the fourth surface 114 in the drawings, but may be provided at some of the perimeter of the fourth surface 114. The recess 114K has a sloped surface S114k which extends outwards from the base body 110 as the first surface 111 is approached and faces inward as the fourth surface 114 is approached. "Inward" corresponds to a direction toward the center of the base body 110 seen from a direction that is perpendicular to the first surface 111, and "outward" corresponds to a direction towards outside of the base body 110 from the center of the base body 110, seen from a direction that is perpendicular to the first surface 111. The sloped surface S114k is sloped with respect to the fourth surface 114 and connects with the fourth surface 114. The sloped surface S114k connects, via a flat surface S114h, with the second surface 112, the third surface 113, the fifth surface 115, and the sixth surface 116 which are adjacent to the fourth surface 114. The flat surface S114h is a surface with a gradient respect to the fourth surface 114 that is lower than the gradient of the sloped surface S114k with respect to the fourth surface 114. The flat surface S114h may be parallel to the fourth surface 114. The recess 114K corresponds to an example of a first recess in the present disclosure.

The base body 110 may have a recess 111K, which is similar to the recess 114K of the fourth surface 114, at the perimeter of the first surface 111. The recess 111K may have a sloped surface S111k and a flat surface S111h which are respectively similar to the sloped surface S114k and the flat surface S114h of the recess 114K. The recess 111K corresponds to an example of a second recess in the present disclosure.

A plurality of wiring conductors 121 may extend from the bottom of the fifth surface 115 to the first surface 111, mediated by the fifth surface 115. Here, up and down may be expressed with the first surface 111 side as upward and the fourth surface 114 side as downward. Up/down directions are similarly expressed hereinafter. In FIG. 2A, illustration is given for an example in which the plurality of wiring conductors 121 are positioned side by side. Respective bottom ends of the plurality of wiring conductors 121 may extend to the recess 114K adjacent to the fifth surface 115. Each of the abovementioned bottom ends may be in contact with the flat surface S114h of the recess 114K. Each of the abovementioned bottom ends may extend to a position where the lower end is in contact with the sloped surface S114k. Upper ends of the plurality of wiring conductors 121 are electrically connected to an electronic component which is mounted to the first surface 111. The bottoms of the plurality of wiring conductors 121 function as application sections EM for an electrically conductive joining material, and are electrically connected to wiring in the module board. By the abovementioned connections, the electronic component on the first surface 111 is electrically connected, via the plurality of wiring conductors 121, to wiring in the module board.

A plurality of wiring conductors 122 are positioned at the bottom of the second surface 112. The plurality of wiring conductors 122 may be positioned side by side. The plurality of wiring conductors 121 may extend to the recess 114K adjacent to the second surface 112. Respective bottom ends of the plurality of wiring conductors 122 may be in contact with the flat surface S114h of the recess 114K. Each of the abovementioned bottom ends may extend to a position where the lower end is in contact with the sloped surface S114k. The plurality of wiring conductors 122 are electrically connected to an electronic component mounted to the second surface 112, and are electrically connected to wiring in the module board. In other words, some of the plurality of wiring conductors 122 function as application sections EM for electrically conductive joining material. By the abovementioned connections, the electronic component on the second surface 112 is electrically connected, via the plurality of wiring conductors 122, to wiring in the module board. A plurality of wiring conductors 123 and 124 are provided at the bottom of the third surface 113 and at the bottom of the sixth surface 116, and are similar to the plurality of wiring conductors 122.

Because an electronic component is not mounted to the sixth surface 116, the plurality of wiring conductors 124 are not connected to an electronic component and may be referred to as dummy wiring conductors. It may be that, similarly to the plurality of wiring conductors 121 to 123, the plurality of wiring conductors 124 function as application sections EM for electrically conductive joining material, and are connected to wiring in the module board via the joining material. By the connections described above, when the wiring board 101 is installed on the module board, it is possible to reduce deviation in form of joining at the four sides of the perimeter of the fourth surface 114.

As illustrated in FIG. 3, the fourth surface 114 has, in a front view, a plurality of corners 114Ca to 114Cd and a plurality of edges 114Sa to 114Sd. Each of the plurality of corners 114Ca to 114Cd is positioned between two adjacent edges among the plurality of edges 114Sa to 114Sd. Furthermore, in the abovementioned front view, an outward outline of the recess 114K has a plurality of edges 114Ta to 114Td which respectively follow the plurality of edges 114Sa to 114Sd described above, and a plurality of corners 114Da to 114Dd. Each of the plurality of corners 114Da to 114Dd is positioned between two adjacent edges among the plurality of edges 114Ta to 114Td. The abovementioned "outward" means a direction facing outside of the fourth surface 114 from the center of the fourth surface 114 in the abovementioned front view. Here, two edges 114Sa and 114Sb which are included in the fourth surface 114 and are mutually adjacent and the corner 114Cb therebetween are referred to as a first edge 114Sa, a second edge 114Sb, and a first corner 114Cb. The edge 114Ta which is of the recess 114K and follows the first edge 114Sa, the edge 114Tb which is of the recess 114K and follows the second edge 114Sb, and the corner 114Db therebetween are referred to as a third edge 114Ta, a fourth edge 114Tb, and a second corner 114Db. In the case described above, a distance Ls between the first edge 114Sa and the third edge 114Ta and the distance Ls between the second edge 114Sb and the fourth edge 114Tb are longer than a distance Lc between the first corner 114Cb and the second corner 114Db. It may be that any two adjacent edges among the plurality of edges 114Sa to 114Sd are extracted, a first edge to fourth edge and first corner and second corner are, as described above, allocated on the basis of these two edges, and the relationship between the abovementioned distances Ls and Lc is established for distances Ls and Lc which are measured on the basis of this allocation. In addition, the abovementioned relationship between the distances Ls and Lc may also be established in a case where the fourth surface 114 is interpreted as the first surface 111, and the recess 114K is interpreted as the recess 111K.

Figure 4:
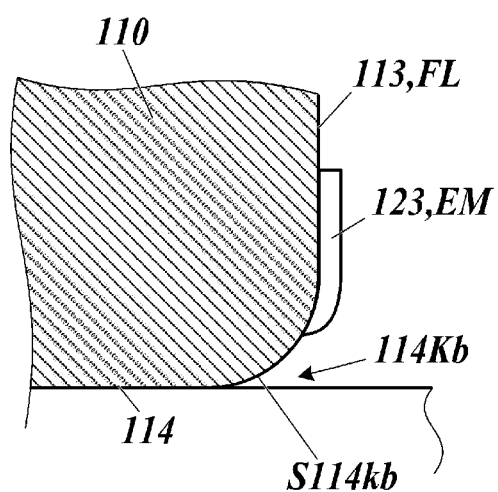
FIG. 4 is a cross-section view that illustrates a variation of a recess.

FIG. 4 is a cross-section view that illustrates a variation of a recess. The base body 110 may have a recess 114Kb, as illustrated in FIG. 4, on the perimeter of the fourth surface 114. The abovementioned recess 114Kb has a sloped surface S114kb of which the gradient continuously changes. The sloped surface S114kb is contiguous with the fourth surface 114 and side surfaces FL of the base body 110. In the configuration of the variation in FIG. 4, the wiring conductors 121 to 124 reach the sloped surface S114kb and extend to the recess 114Kb. The recess 114Kb corresponds to an example of a first recess in the present disclosure.

<Method of Manufacturing Wiring Board>

The base body 110 is, for example, an aluminum oxide ($Al_2O_3$) sintered body, and, for example, can be manufactured by molding material in accordance with a dry uniaxial press method, baking a molding, and performing deburring in accordance with, for example, barrel polishing of the baked molding. In the press method, an $Al_2O_3$ powder is inserted into a cavity made by inserting a lower punch into a die (mold), and the powder is compressed from above by an upper punch. The cavity, which is surrounded by the die, the lower punch, and the upper punch, has the shape of the base body 110 in FIG. 1 through FIG. 3. In addition to the $Al_2O_3$ powder, a powder such as silica ($SiO_2$), magnesia (MgO), or calcia (CaO) which are sintering aids, may be added to powder which fills the die. The die may also be filled with a preformed body that includes the abovementioned powder. The preformed body may be shaped by adding an appropriate binder, solvent, and plasticizer to the abovementioned powder, and kneading this. The pressure in the press method is 0.3 ton/cm$^2$, for example. The sintering temperature is 1700° C., for example.

The wiring conductors 121 through 124 can be, for example, formed by printing a conductor paste in accordance with a screen printing method or the like, and being sintered together with the base body 110. The conductor paste is manufactured by adding an appropriate solvent and binder to a powder of a metal such as tungsten, molybdenum, manganese, silver, or copper, kneading and mixing the solvent, binder, and metal powder, and making adjustments to have an appropriate viscosity. The conductor paste may include glass or ceramics in order to increase the strength of the joint with the base body 110. The wiring conductors 121 to 124 may be formed by another method such as vapor deposition or plating.

<Electronic Device and Electronic Module>

Figure 5:
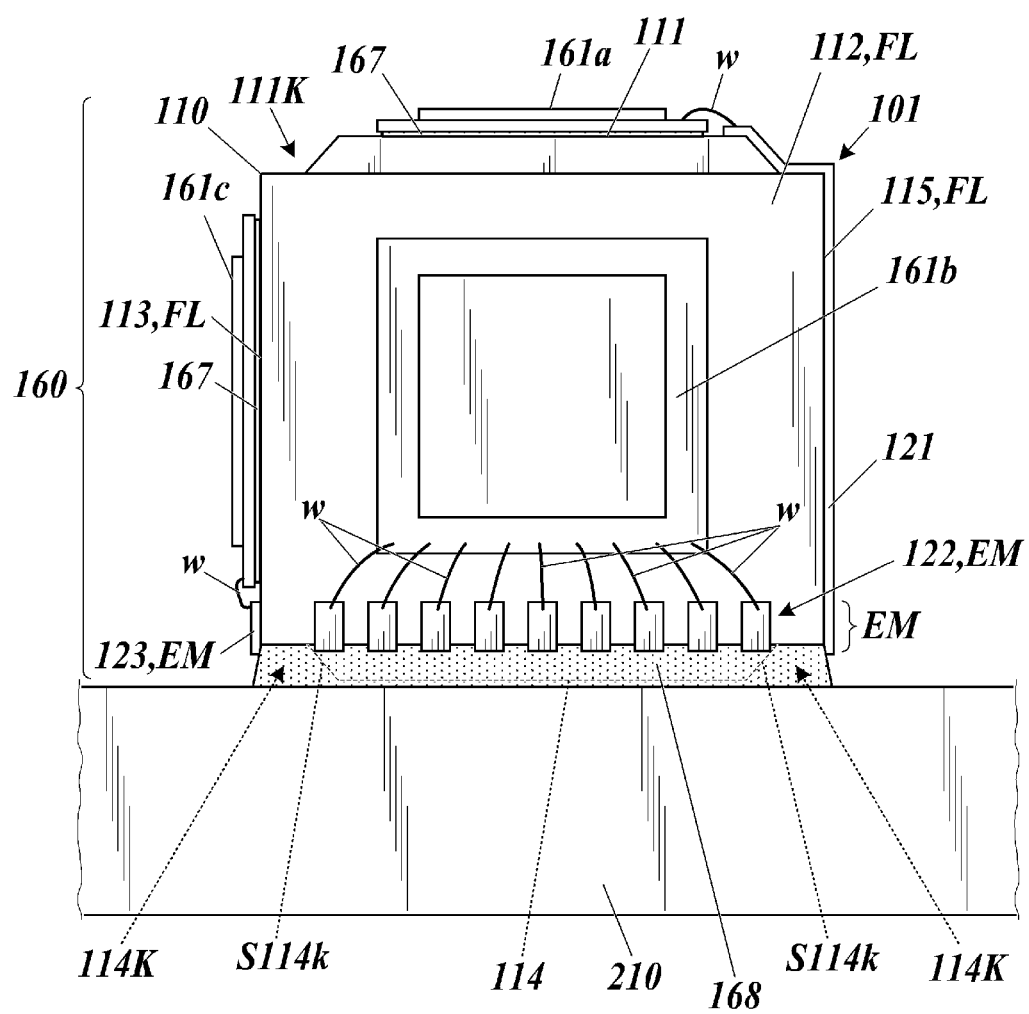
FIG. 5 is a front view that illustrates a state in which an electronic device according to the first embodiment of the present disclosure is joined to a module board.
Figure 6:
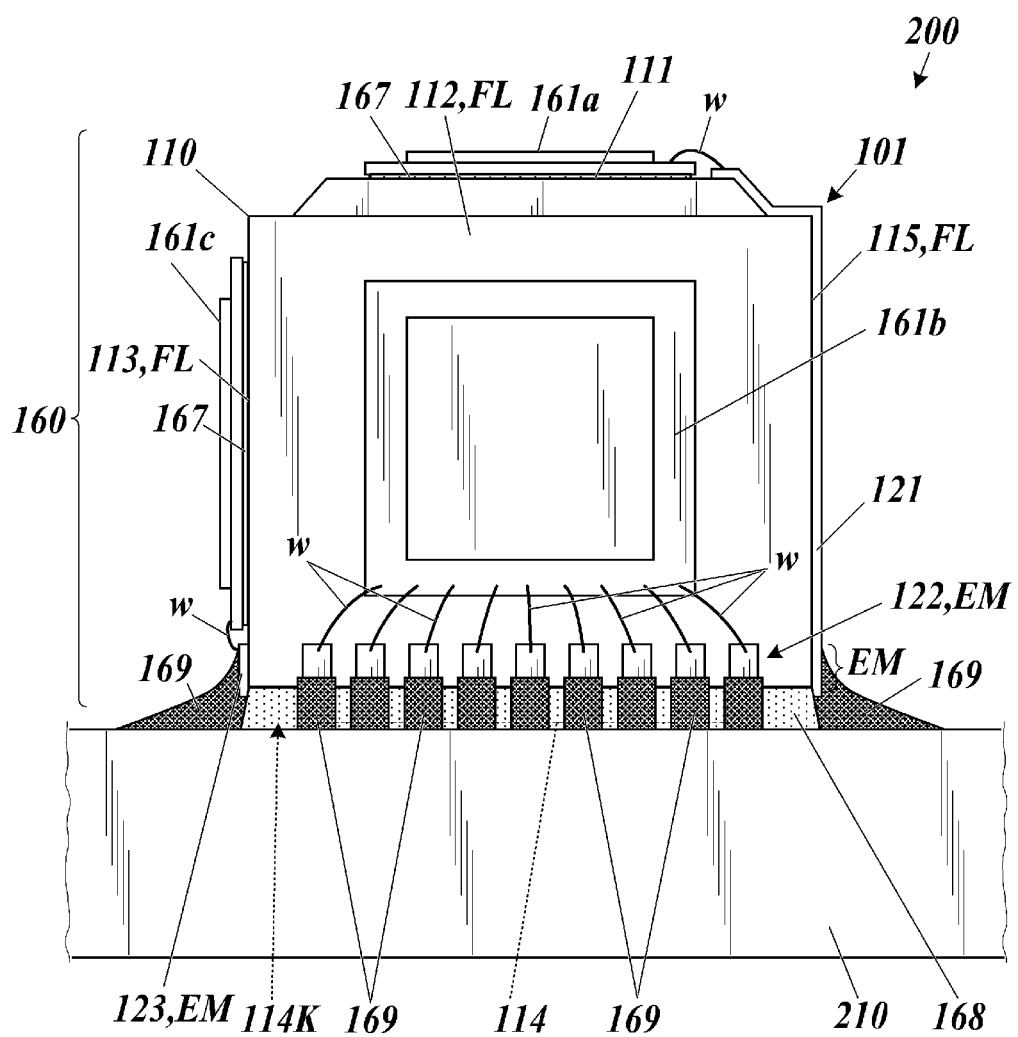
FIG. 6 is a front view that illustrates an electronic module according to the first embodiment of the present disclosure.

FIG. 5 is a front view that illustrates a state in which an electronic device according to the first embodiment of the present disclosure is joined to a module board. FIG. 6 is a front view that illustrates an electronic module according to the first embodiment of the present disclosure.

An electronic device 160 according to the first embodiment is provided with the wiring board 101, and a plurality of electronic components 161a to 161c which are mounted to the wiring board 101. Each of the electronic components 161a to 161c is an angular velocity sensor or acceleration sensor having one detection axis, but may be another sensor having a detection axis, a sensor that does not have a detection axis, or an electronic component which is not a sensor. The electronic components 161a to 161c are respectively mounted to the first surface 111, the second surface 112, and the third surface 113. The electronic components 161a to 161c may be fixed to the wiring board 101 via an adhesive material 167 which is a resin or the like. The electronic components 161a to 161c may be respectively electrically connected to the wiring conductors 121, 122, and 123 via bonding wires w for example, or may be respectively electrically connected to the wiring conductors 121, 122, and 123 via an electrically conductive joining material such as solder.

An electronic module 200 according to the first embodiment is configured by the electronic device 160 being installed on the module board 210. In addition to the electronic device 160, another electronic device, an electronic element, an electrical element, or the like may be installed on the electronic module 200.

The electronic device 160 is installed as follows. Firstly, as illustrated in FIG. 5, the electronic device 160 is pressed against the module board 210 in a state where adhesive material 168 which is a resin or the like is deposited between the fourth surface 114 of the electronic device 160 and the module board 210. At this time, the adhesive material 168 thinly expands between the fourth surface 114 and the module board 210, and the adhesive material 168 pressed out from between the fourth surface 114 and the module board 210 fills the recess 114K. By the abovementioned adhesive material 168 curing, the electronic device 160 is fixed to the module board 210. Subsequently, as illustrated in FIG. 6, by a conductive joining material 169 such as conductive paste being applied between the application sections EM of the wiring conductors 121 to 124 of the electronic device 160 and the wiring of the module board 210 and the joining material 169 curing, each of the wiring conductors 121 to 124 are electrically connected to wiring of the module board 210.

In accordance with the wiring board 101 according to the first embodiment as above, the base body 110 has the first surface 111, the second surface 112, and the third surface 113 for mounting the electronic components 161a to 161c, and also has the fourth surface 114 which is an installation surface and is opposite to the first surface 111. By virtue of the configuration described above, because relative angles between the mounted plurality of electronic components 161a to 161c are determined in advance in accordance with the shape of the base body 110, the difficulty of aligning the relative angles between the electronic components 161a to 161c at a time of installation decreases. Furthermore, by aligning the fourth surface 114 to the board surface of the module board 210, the relative angles between the board surface of the module board 210 and the electronic components 161a to 161c is determined in accordance with the shape of the base body 110, and variation of these relative angles at a time of installation is reduced.

Furthermore, by virtue of the wiring board 101 according to the first embodiment, the recess 114K which is recessed from the fourth surface 114 is provided at the perimeter of the fourth surface 114. By the recess 114K being present, the area of the fourth surface 114 decreases, and it is easier to uniformly spread the adhesive material 168 between the fourth surface 114 and the board surface of the module board 210. Accordingly, the parallelism between the fourth surface 114 and the board surface can be easily improved. Furthermore, because the adhesive material 168 which is pushed outward accumulates in the recess 114K as illustrated in FIG. 5, the expansion of the adhesive material 168 to other portions above the module board 210 is suppressed and fixing strength for the wiring board 101 improves in accordance with the adhesive material 168 which has cured in the recess 114K. For example, a 3-axis acceleration sensor or a 3-axis angular velocity sensor is mounted in a device that moves such as an automobile or a robot and thus is required to withstand vibration or acceleration. By virtue of the wiring board 101 according to the first embodiment, it is possible to respond to this requirement in accordance with the adhesive material 168 which accumulates in the recess 114K. In addition, the rigidity of the connection between the wiring board 101 and the module board 210 increases, and it is possible to suppress natural vibration from occurring in the wiring board 101.

Furthermore, by virtue of the wiring board 101 according to the first embodiment, the wiring conductors 121 to 124 extend to the recess 114K. By virtue of the configuration described above, it is possible to fix portions of the wiring conductors 121 to 124 in accordance with the adhesive material 168 that accumulates in the recess 114K. Accordingly, it is possible to suppress peeling of the wiring conductors 121 to 124 due to vibration or acceleration.

Furthermore, by virtue of the wiring board 101 according to the first embodiment, the recess 114K has the sloped surface S114k which is connected to the fourth surface 114. By the abovementioned sloped surface S114k, when the adhesive material 168 is pressed out from the fourth surface 114 into the recess 114K, the adhesive material 168 moves along the sloped surface S114k, and it is more likely for the adhesive material 168 to fill between the recess 114K and the board surface of the module board 210 without a gap. Accordingly, it is possible to suppress variation of the fixing strength in the recess 114K.

Furthermore, by virtue of the wiring board 101 according to the first embodiment, the recess 114K is present at the entire perimeter of the fourth surface 114. Accordingly, it is possible to increase the fixing strength in accordance with the recess 114K at the entire perimeter of the wiring board 101. Furthermore, by the rigidity of the connection between the wiring board 101 and the module board 210 increasing at the entire perimeter of the wiring board 101, it is possible to obtain an effect of suppressing natural vibration in the wiring board 101 with respect to various vibration directions. In addition, even if the adhesive material 168 expands or contracts at a time of curing, because the stress thereof occurs uniformly at the entire perimeter of the wiring board 101, it is possible to suppress a change in orientation of the wiring board 101 due to curing of the adhesive material 168.

Furthermore, by virtue of the wiring board 101 according to the first embodiment, application sections EM (portions of the wiring conductors 121 to 124) for the conductive joining material 169 are provided at respective bottoms (edges close to the fourth surface 114) of the second surface 112, the third surface 113, the fifth surface 115, and the sixth surface 116 which are adjacent to the fourth surface 114 with the recess 114K sandwiched therebetween. In the electronic module 200 according to the first embodiment, the conductive joining material 169 is positioned extending from the module board 210 to the side surfaces FL of the wiring board 101. Accordingly, joining between the wiring board 101 and the module board 210 is also achieved by the conductive joining material 169, and the fixing strength for the wiring board 101 can be further improved. Furthermore, the rigidity of the connection between the wiring board 101 and the module board 210 improves further, and it is possible to further suppress natural vibration from occurring in the wiring board 101.

Furthermore, by virtue of the wiring board 101 according to the first embodiment, the bottoms of the wiring conductors 121 to 123 which are electrically connected to the electronic components 161a to 161c function as application sections EM to which the conductive joining material 169 is applied. In addition, the bottoms of the dummy wiring conductors 124 also function as application sections EM to which the conductive joining material 169 is applied. By the dummy wiring conductors 124 being added, the wiring board 101 has application sections EM, to which the conductive joining material 169 is applied, at all m (m is 4 in the example of FIG. 1) side surfaces FL (the second surface 112, the third surface 113, the fifth surface 115, and the sixth surface 116) that surround the fourth surface 114. In the electronic module 200 according to the first embodiment, the conductive joining material 169 is positioned extending from the module board 210 to each of the abovementioned m side surfaces FL of the wiring board 101. Accordingly, the joint in accordance with the joining material 169 is performed uniformly in every direction for the fourth surface 114, enables the fixing strength for the wiring board 101 to be further improved, and increases the rigidity of connections in every direction to thereby enable an effect of suppressing natural vibration of the wiring board 101 with respect to various vibration directions to be achieved.

Furthermore, by virtue of the wiring board 101 according to the first embodiment, the distance Ls which is between the edges 114Sa to 114Sd and the edges 114Ta to 114Td and which is described with reference to FIG. 3 is longer than the distance Lc which is between the corners 114Ca to 114Cd and the corners 114Da to 114Dd and which is described with reference to FIG. 3. Accordingly, it is possible to make the volume of the space between the wiring board 101 and the module board 210 which occurs due to the recess 114K be smaller at the corners 114Ca to 114Cd. Accordingly, the adhesive material 168 pressed out from the fourth surface 114 is likely to spread throughout the entirety of the recess 114K even at the corners. Accordingly, it is possible to achieve a high joint strength in accordance with the adhesive material 168 in a range that includes most of the perimeter of the fourth surface 114, and it is also possible to increase the rigidity of the connection between the wiring board 101 and the module board 210 in a range that includes most of the perimeter of the fourth surface 114.

Furthermore, by virtue of the wiring board 101 according to the first embodiment, there is the recess 111K at the perimeter of the first surface 111. By virtue of the configuration described above, because the area of the first surface 111 can be smaller than in a case in which the recess 111K were not present, positioning of the electronic component 161a becomes easier. Furthermore, a weight balance that includes the electronic components 161a to 161c stabilizes, and it is possible to increase an effect of suppressing natural vibration of the wiring board 101 with respect to various vibration directions. Furthermore, by virtue of the sloped surface S111k of the recess 111K, it is possible to disperse stress applied to the wiring conductors 121 due to thermal expansion.

By virtue of the electronic device 160 and the electronic module 200 according to the first embodiment, by having the wiring board 101, the ease of assembly in which the relative angles between the plurality of electronic components 161a to 161c and the module board 210 are aligned with high accuracy improves. Accordingly, it is possible to address improving performance and reducing costs for the electronic device 160 and the electronic module 200.

Description was given above regarding the first embodiment of the present invention. However, the present invention is not limited to the first embodiment described above. For example, in the first embodiment described above, description was given by taking as an example a configuration in which the base body 110 of the wiring board 101 is a cube or a rectangular parallelepiped. However, in accordance with the number of electronic components to mount and the relative angles required for between the plurality of electronic components and the module board, a base body for which one or both of a number of surfaces and relative angles between respective surfaces differ from that in the first embodiment may be employed. In addition, in the first embodiment described above, description was given for a configuration in which the recess 114K is at the entire perimeter of the fourth surface 114, but a configuration in which the recess 114K is not at a partial range of the perimeter of the fourth surface 114 may be employed. Even in this case, in the range where the recess 114K is present, it is possible to achieve the effect of the recess 114K. In addition, details described in the first embodiment can be changed, as appropriate, in a range that does not deviate from the spirit of the invention.

Second Embodiment

Figure 7:
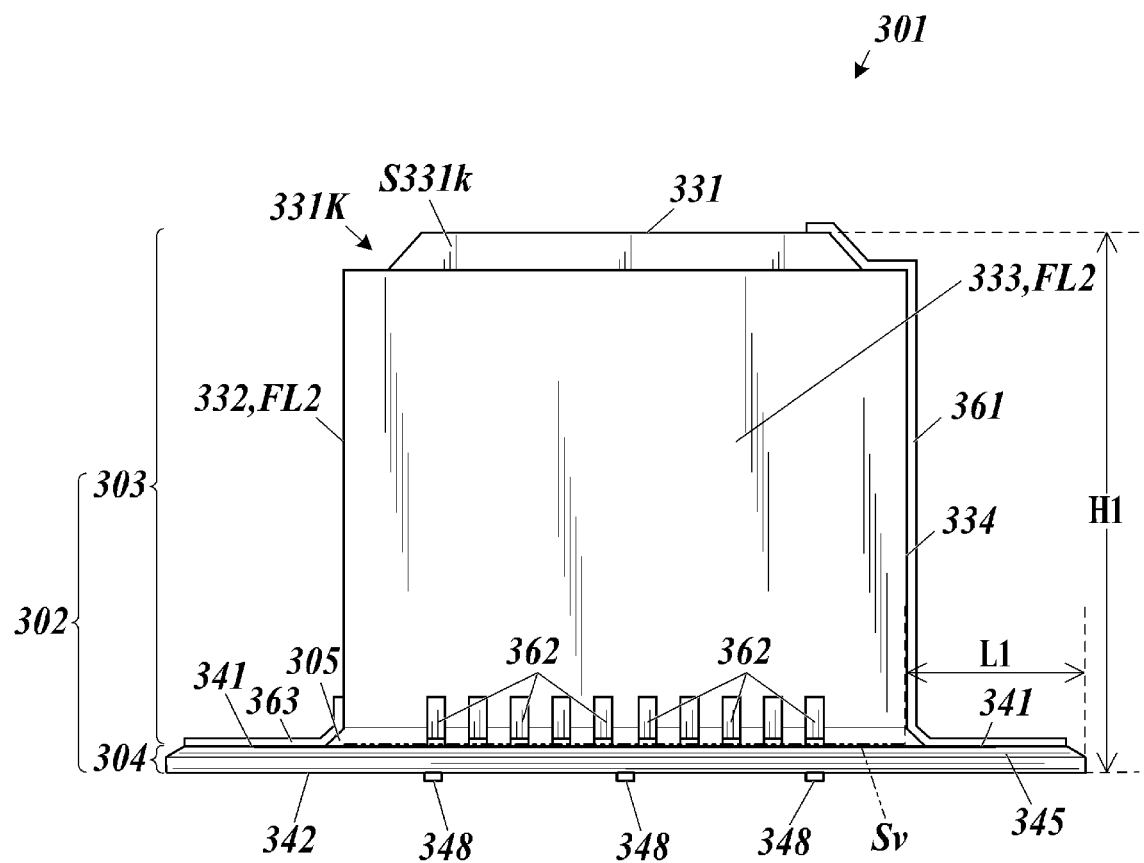
FIG. 7 is a front view that illustrates a wiring board according to a second embodiment of the present disclosure.
Figure 8:
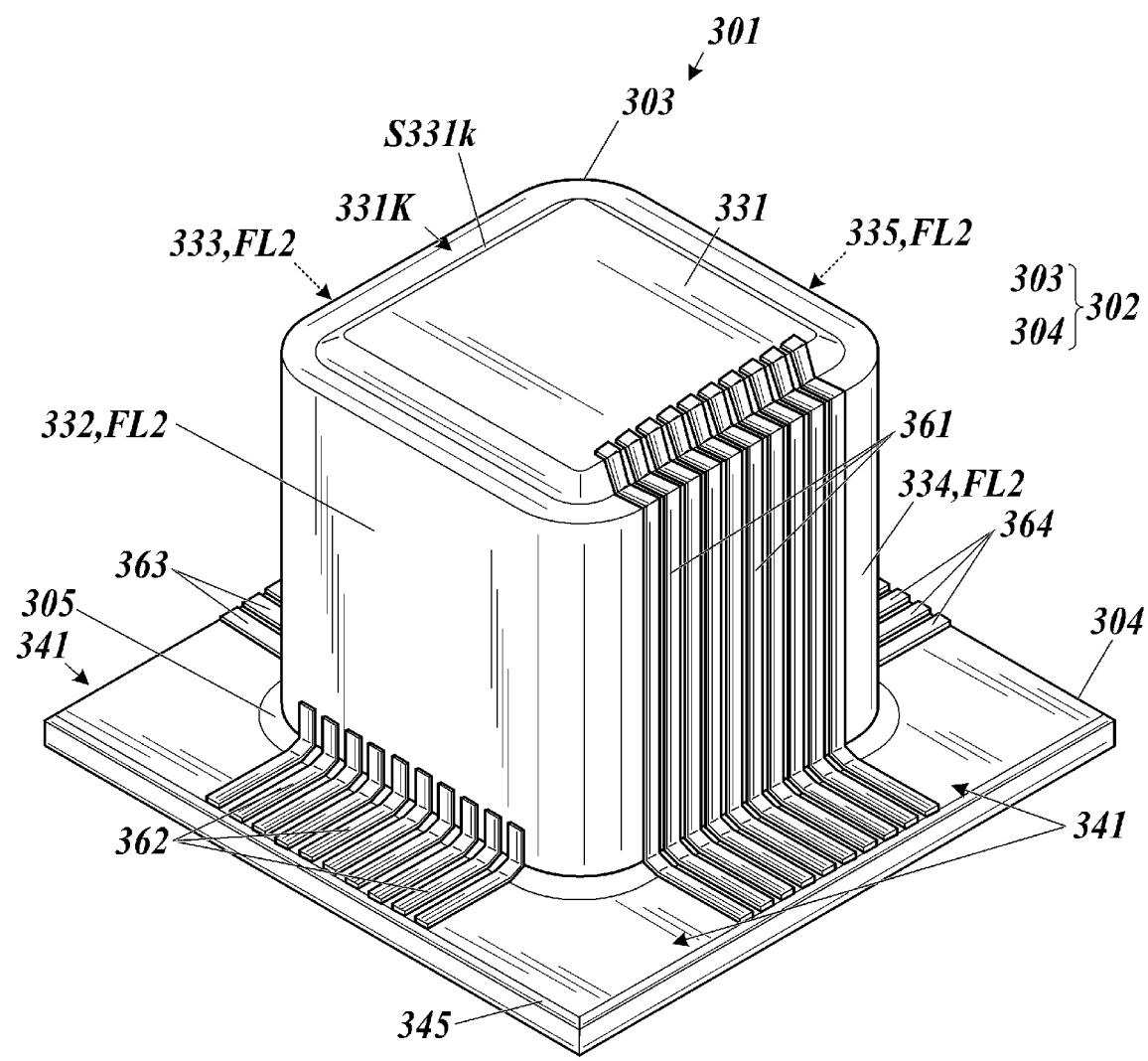
FIG. 8 is a perspective view that illustrates the wiring board of FIG. 7.
Figure 9:
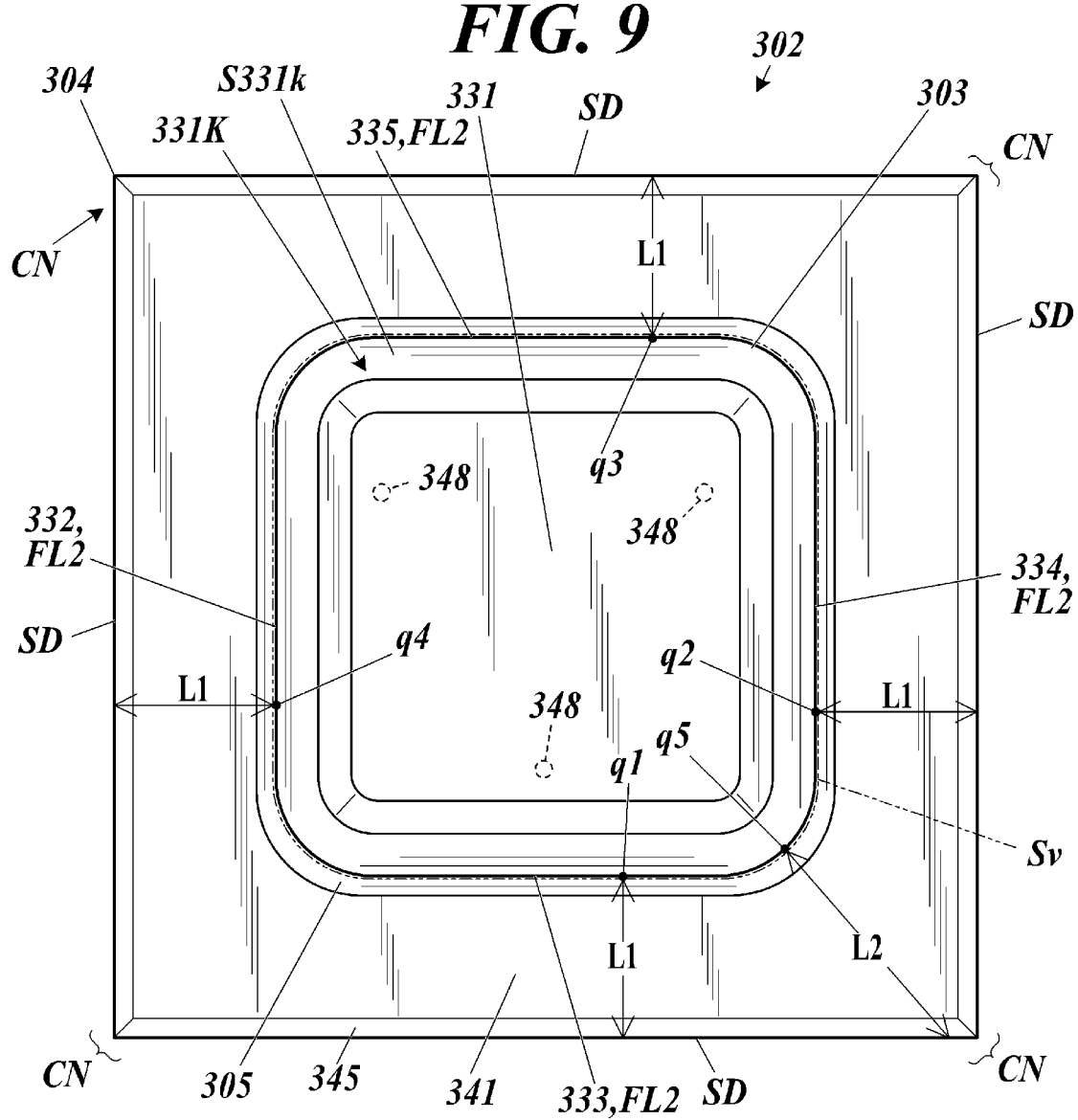
FIG. 9 is a plan view that illustrates a base body of the wiring board of FIG. 7.
Figure 10:
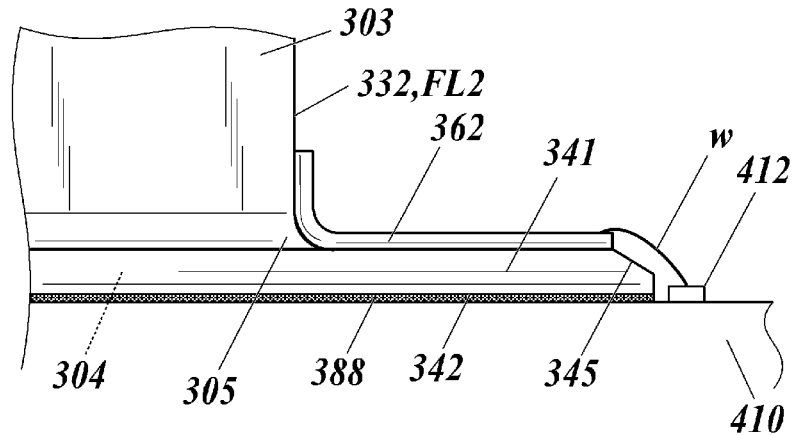
FIG. 10 is a view that illustrates a variation of a thick section.

FIG. 7 is a front view that illustrates a wiring board according to a second embodiment of the present disclosure. FIG. 8 is a perspective view that illustrates the wiring board of FIG. 7. FIG. 9 is a plan view that illustrates a base body of the wiring board of FIG. 7. FIG. 10 is a view that illustrates a variation of a thick section.

A wiring board 301 of the second embodiment is provided with a base body 302 having insulating properties, and wiring conductors 361 to 364 positioned above the base body 302. At least some of the wiring conductors 361 to 364 are positioned on the surface of the base body 302.

The base body 302 has a first surface 331, a second surface 332, and third surface 333 which are to be mounted with electronic components, and a fourth surface 342 positioned opposite to the first surface 331. The second surface 332 and the third surface 333 are positioned at side surfaces FL2 between the first surface 331 and the fourth surface 342. The fourth surface 342 functions as an installation surface which is adhered via a joining material to a module board (for example, a module board 410 in FIG. 11). Furthermore, the base body 302 has a sixth surface 335 which is opposite to the second surface 332. The base body 110 also has a fifth surface 334 which is opposite to the third surface 333. The first surface 331, the second surface 332, the third surface 333, the fourth surface 342, the fifth surface 334, and the sixth surface 335 may be planar. Rounding or a notch may be provided at the periphery of the first surface 331, the second surface 332, the third surface 333, the fourth surface 342, the fifth surface 334, and the sixth surface 335. The first surface 331, the second surface 332, and the third surface 333 which are to be mounted with electronic components, even if not planar, may have the same surface condition as when the electronic components are mounted to a flat surface. In addition, the fourth surface 342 which is an installation surface may also, when installed on a module board, have the same surface condition as when the fourth surface 342 is a flat surface.

The base body 302 has a polyhedron section 303 and a board-like section 304 that connects to the bottom of the polyhedron section 303. The polyhedron section 303 and the board-like section 304 may be integrally molded in accordance with a single member. The board-like section 304 and the polyhedron section 303 are connected, but assuming that there is a virtual boundary plane Sv (FIG. 7 and FIG. 9) between the board-like section 304 and the polyhedron section 303, one side of the boundary plane Sv is deemed to be the polyhedron section 303 and the other side is deemed to be the board-like section 304.

The polyhedron section 303 has a convex polyhedron shape when the boundary plane Sv is treated as one outer surface of the polyhedron section 303. The convex polyhedron shape is not limited to a strict convex polyhedron defined in geometry, and implies forms that include fine structures such as rounding, notches or protrusions at corners of a convex polyhedron, and forms that include fine structures such as grooves, holes, or protrusions on planes of a convex polyhedron. The convex polyhedron shape produces an effect in that, by setting respective planes of a solid as mounting surfaces for a plurality of electronic components as well as surfaces that are parallel to the module board 410 (FIG. 11), the relative angles between the board surface of the module board 410 (FIG. 11) and the plurality of electronic components are determined in accordance with the relative angles between respective surfaces of the convex polyhedron. The convex polyhedron shape implies a shape that includes, in a strict convex polyhedron, fine differences in a range that does not inhibit the abovementioned effect.

The first surface 331, the second surface 332, the third surface 333, the fifth surface 334, and the sixth surface 335 described above correspond to a plurality of outer surfaces for the polyhedron section 303, apart from the boundary plane Sv. The surface opposite to the boundary plane Sv corresponds to the first surface 331. The fourth surface 342 corresponds to a surface for the board-like section 304 that is opposite to the first surface 331. The first surface 331 to the third surface 333 may have relative angles that are mutually orthogonal. The first surface 331 and the fourth surface 342 may be parallel. The first surface 331 and the boundary plane Sv (FIG. 7 and FIG. 9) may be parallel. The second surface 332 and the fifth surface 334 may be parallel. The third surface 333 and the sixth surface 335 may be parallel.

The board-like section 304 has a flat board shape, and, as illustrated in FIG. 9, when seen from above overlaps with the polyhedron section 303 and extends outward from the outline of the polyhedron section 303 at the entire perimeter thereof. The extended portion described above is referred to as an extension 341. Here, up and down may be expressed with a first surface 331 side as upward and a fourth surface 342 side as downward. Up/down directions are similarly expressed hereinafter. "Outward" means a direction from the center of the boundary plane Sv towards outside, seen from above. From between the fourth surface 342 which is the bottom surface of the board-like section 304 and side surfaces FL2 of the base body 302 which has the second surface 332, the third surface 333, the fifth surface 334, and the sixth surface 335, the extension 341 juts outward from these side surfaces FL2. The side surfaces FL2 may be referred to as side surfaces of the polyhedron section 303. The top surface of the extension 341 includes a portion that is approximately parallel to the fourth surface 342. Note that the extension 341 does not need to be positioned at the entire perimeter of the polyhedron section 303, seen from above. For example, it may be that the extension 341, seen from above, extends in for example only one direction from the outline of the polyhedron section 303 (for example, a direction that goes beyond only one of the second surface 332, the third surface 333, the fifth surface 334, and the sixth surface 335), or extends in only two or three directions (for example, in directions that go beyond only two or three of the second surface 332, the third surface 333, the fifth surface 334, and the sixth surface 335).

As illustrated in FIG. 7 and FIG. 9, jutting lengths L1 and L2 for the extension 341 are greater than or equal to one quarter (¼) of a height H1 (FIG. 7) of the base body 302. The jutting lengths L1 and L2 for the extension 341 correspond to minimum distances from the outer edges of the extension 341 to connections q1 to q4 (FIG. 9) between the polyhedron section 303 and the board-like section 304. The height H1 of the base body 302 corresponds to the height of a portion that combines the polyhedron section 303 and the board-like section 304. Note that, for the jutting length of the extension 341, the longest jutting length may be longer than a quarter of the height H1 of the base body 302.

Furthermore, the extension 341 has four corners CN and four edges SD which are included in the outline when the extension 341 is seen from a direction orthogonal to the first surface 331. A minimum distance L1 from each of the four edges SD to the start of the extension 341 is shorter than a minimum distance L2 from each of the four corners CN to the start of the extension 341. The start corresponds to the connections (q1 to q5) between the polyhedron section 303 and the board-like section 304. Although only five connections q1 to q5 are illustrated in FIG. 9, the abovementioned connections mean the entire perimeter of the virtual boundary plane Sv.

Furthermore, the extension 341 has, at a portion of the extension 341 which is close to the side surfaces FL2 of the base body 302, a thick section 305 which is thicker than other portions of the extension 341. By the top surface of the extension 341 jutting upward, the thick section 305 is thicker than other portions. It may be that the thick section 305 connects with the polyhedron section 303, and has a slope, the height of which decreases as the distance from the polyhedron section 303 increases. The slope of the thick section 305 may be a linear slope as illustrated in FIG. 7, or may be a slope with a curved surface which is gradually contiguous with the side surfaces FL2 (the second surface 332, the third surface 333, the fifth surface 334, and the sixth surface 335) as illustrated by a variation in FIG. 10. The extension 341 may have the thick section 305 at all portions close to the side surfaces FL2 of the base body 302. In a case where the extension 341 is positioned between the fourth surface 342 and all side surfaces FL2 of the base body 302, in other words in a case where the extension 341 extends from the entire perimeter of the side surfaces FL2 of the base body 302, the extension 341 may have the thick section 305 at all portions close to the side surfaces FL2 of the base body 302.

The base body 302 may further have a recess 331K recessed from the first surface 331, at the perimeter of the first surface 331. The recess 331K may have a sloped surface S331k which approaches the height of the first surface 331 as the center of the first surface 331 is approached. The recess 331K corresponds to an example of a third recess according to the present disclosure.

Furthermore, the extension 341 has notches 345 at upper edges on sides far from the side surfaces FL2 of the base body 302.

The base body 302 also has a plurality of protrusions 348 on the fourth surface 342. The plurality of protrusions 348 includes at least three protrusions 348 which do not line up in a straight line, and give three-point support for the base body 302. The three protrusions 348 may be formed with a height at which ends of the three protrusions 348 make contact with the same plane. The protrusions 348 may be integrally formed in accordance with the same member as the polyhedron section 303 and the board-like section 304, or may be configured by metal being joined via a metallized layer. The protrusions 348 may have a shape that is long along the fourth surface 342.

Figure 11:
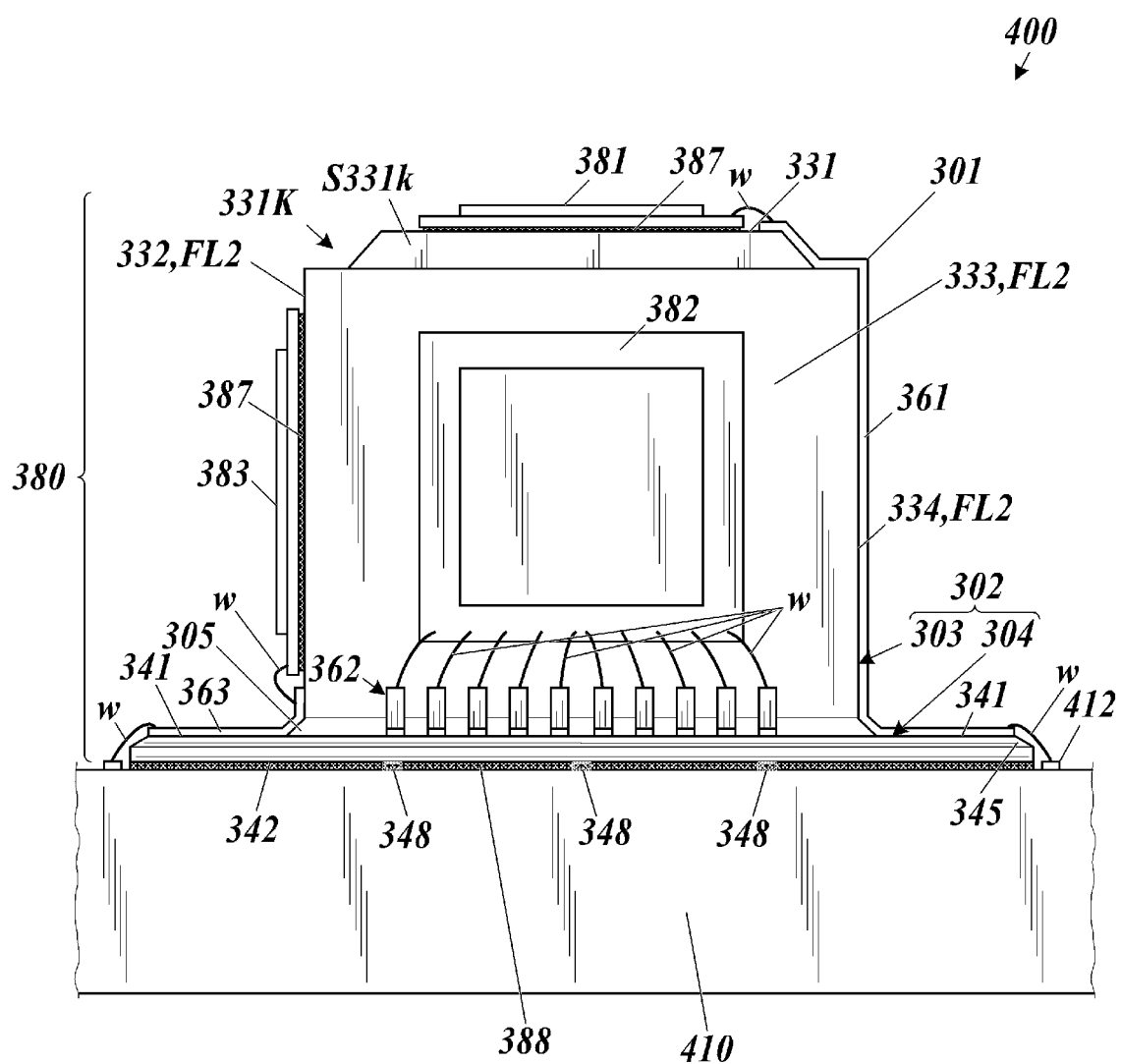
FIG. 11 is a side surface view that illustrates an electronic device and an electronic module according to a second embodiment of the present disclosure.

A plurality of wiring conductors 361 extend from an edge of the extension 341 (before the notch 345) to the first surface 331, mediated by the top surface of the extension 341, the thick section 305, the fifth surface 334, and the recess 331K. One end of each of the plurality of wiring conductors 361 is electrically connected to an electronic component which is mounted to the first surface 331. The other end of each of the plurality of wiring conductors 361 is electrically connected to wiring in the module board 410 (FIG. 11). The abovementioned electrical connections are performed via bonding wires w (refer to FIG. 11) for example, but may be performed via an electrically conductive joining material such as solder.

A plurality of wiring conductors 362 extend from an edge of the extension 341 (before the notch 345) to the third surface 333, mediated by the top surface of the extension 341 and the thick section 305. One end of each of the plurality of wiring conductors 362 is electrically connected to an electronic component which is mounted to the third surface 333. The other end of each of the plurality of wiring conductors 362 is electrically connected to wiring in the module board 410 (FIG. 11). The abovementioned electrical connections are performed via bonding wires w (refer to FIG. 11) for example, but may be performed via an electrically conductive joining material such as solder.

The plurality of wiring conductors 363 and the plurality of wiring conductors 364 have similar configurations to that of the plurality of wiring conductors 362, and are respectively provided on the second surface 332 side and the sixth surface 335 side. The plurality of wiring conductors 364 may be referred to as dummy wiring conductors 364 because they are not electrically connected to an electronic component as an electronic component is not mounted to the sixth surface 335. The wiring conductors 364 may be omitted.

<Method of Manufacturing Wiring Board>

The base body 302 can be manufactured similarly to the base body 110 according to the first embodiment, using a die that has a cavity corresponding to the shape of the base body 302 illustrated in FIG. 7 to FIG. 9. The wiring conductors 361 to 364 can also be formed similarly to the wiring conductors 121 to 124 according to the first embodiment.

<Electronic Device and Electronic Module>

FIG. 11 is a side surface view that illustrates an electronic device and an electronic module according to a second embodiment of the present disclosure.

An electronic device 380 according to the second embodiment is provided with a wiring board 301, and a plurality of electronic components 381 to 383 which are respectively mounted to the first surface 331, the second surface 332, and the third surface 333 of the wiring board 301. Each of the electronic components 381 to 383 is an angular velocity sensor or acceleration sensor having one detection axis, but may be a sensor having another detection axis, a sensor that does not have a detection axis, or an electronic component which is not a sensor. The electronic components 381 to 383 may be fixed to the wiring board 301 via an adhesive material 387 which is a resin or the like. The electronic components 381 to 383 may be respectively electrically connected to the wiring conductors 361, 362, and 363 via bonding wires w, for example.

An electronic module 400 according to the second embodiment is configured by the electronic device 380 being installed on the module board 410. In addition to the electronic device 380, another electronic device, an electronic element, an electrical element, or the like may be installed on the electronic module 400.

The electronic device 380 is installed as follows. Firstly, the electronic device 380 is pressed against the module board 410 in a state where the adhesive material 388 which is a resin or the like is deposited between the fourth surface 342 of the electronic device 380 and the module board 410. The protrusions 348 of the board-like section 304 are thus pressed so as to be almost in contact with the module board 410, and the adhesive material 388 spreads at a predetermined thickness between the board-like section 304 and the module board 410. At this time, the fourth surface 342 (installation surface), by being supported via the plurality of protrusions 348, is made to be parallel to the board surface of module board 410, and the adhesive material 388 expands over the entirety of the fourth surface 342 at a thickness approximately equivalent to the height of the protrusions 348. By the abovementioned adhesive material 388 curing, the electronic device 380 is fixed to the module board 410.

Next, wiring conductors 412 of the module board 410 are electrically connected to the wiring conductors 361, 362, and 363 of the electronic device 380 via bonding wires w. In FIG. 11, wiring conductors 412 and bonding wires w joined to the wiring conductors 362 that are in front are omitted. The bonding wires w are joined to portions of the wiring conductors 361, 362, and 363 close to edges of the extension 341 which are far from the side surfaces FL2 of the base body 302. The bonding wires w are gold wire, and shortening of the wire length used at a time of installation is addressed.

As above, by virtue of the wiring board 301 according to the second embodiment, the base body 302 has the first surface 331, the fourth surface 342 which is positioned opposite from the first surface 331, and the second surface 332 and the third surface 333 which are positioned at side surfaces FL2 between the first surface 331 and the fourth surface 342, with the first surface 331 to the third surface 333 being mounting surfaces for the electronic components 381 to 383, and the fourth surface 342 being an installation surface. By virtue of the configuration described above, the relative angles between the plurality of electronic components 381 to 383 mounted to the wiring board 301 are determined in advance in accordance with the shape of the base body 302. Furthermore, by aligning the fourth surface 342 of the base body 302 at an angle that is parallel with the board surface of the module board 410, the relative angles between the board surface of the module board 410 and the electronic components 381 to 383 are determined in advance in accordance with the shape of the base body 302. Accordingly, it is possible to improve the ease of assembly in which the relative angles between the electronic components 381 to 383 and the board surface of the module board 410 are aligned at a time of installation.

Furthermore, between side surfaces FL2, which have the second surface 332, the third surface 333, the fifth surface 334, and the sixth surface 335, and the fourth surface 342, the base body 302 has the extension 341 which juts outward from the side surfaces FL2. By virtue of the configuration described above, the area for joining the fourth surface 342 and the module board 410 increases when the electronic device 380 is installed on the module board 410. By the joint area becoming larger than a range occupied by the polyhedron section 303 to which the electronic components 381 to 383 are mounted, high rigidity is achieved at the connection between the module board 410 and the wiring board 301. In accordance with high rigidity, it is possible to suppress natural vibration from arising in the wiring board 301, even in the case where external force is applied to the module board 410 and inertial force thereby acts on the wiring board 301.

Furthermore, by virtue of the wiring board 301 according to the second embodiment, the extension 341 has, at a portion of the extension 341 which is close to the side surfaces FL2 of the base body 302, a thick section 305 which is thicker than other portions of the extension 341. In accordance with this thick section 305, it is possible to reduce the peak of a resonant frequency characteristic of solely the polyhedron section 303 and the peak of a resonant frequency characteristic of solely the board-like section 304, and suppress the occurrence of coupled vibration in which the natural vibration of solely the polyhedron section 303 and the natural vibration of solely the board-like section 304 are combined.

Furthermore, by virtue of the wiring board 301 according to the second embodiment, the extension 341 is present over the entire area between the side surfaces FL2 of the base body 302 and the fourth surface 342, and all of a portion of the extension 341 which is close to the side surfaces FL2 is the thick section 305. By the configuration described above, it is possible to achieve an effect of suppressing natural vibration of the wiring board 301 with respect to various vibration directions.

Furthermore, by virtue of the wiring board 301 according to the second embodiment, the minimum distance L1 from each of the four edges SD of the extension 341 to the start of the extension 341 is shorter than the minimum distance L2 from each of the four corners CN to the start of the extension 341. By the configuration described above, it is possible to achieve an effect in that it is easier to press the wiring board 301 against the module board 410 by using the corners CN of the extension 341, at a time of mounting the wiring board 301.

Furthermore, by virtue of the wiring board 301 according to the second embodiment, the longest jutting length (for example, the length L2 in FIG. 9) of the extension 341 is longer than a quarter (¼) of the height H1 of the base body 302. By the configuration described above, by adhering the fourth surface 342 which includes the bottom surface of the extension 341 to the module board 410, the rigidity of the connection between the module board 410 and the wiring board 301 increases further, and it is possible to further suppress natural vibration which occurs in the wiring board 301.

Furthermore, by virtue of the wiring board 301 according to the second embodiment, there are the notches 345 in the upper edges of the extension 341. At a time of wire bonding, it is not possible to drop a bonding needle very close to the edge of the wiring board 301 because the risk of damage to the wiring board 301 arises. However, by the notches 345 being present and the strength of the edge increasing, it is possible to drop a bonding needle very close to a notch 345. By the notches 345 being present, it is possible to avoid interference between a bonding wire w and the edge of the extension 341, even if the route for the bonding wire w is shortened. Accordingly, it is possible to shorten the length of a bonding wire w that is used, and reduce the cost for the electronic module 400.

Furthermore, by virtue of the wiring board 301 according to the second embodiment, the fourth surface 342 has the plurality of protrusions 348 that give three-point support for the base body 302. When the area in which the board-like section 304 extends is enlarged and the area for joining the module board 410 and the wiring board 301 is enlarged, the area of the fourth surface 342 on which the adhesive material 388 spreads increases at a time of installation. Furthermore, there is a need to thinly spread the adhesive material 388, a need to press the wiring board 301 against the module board 410 with very strong force arises, and the parallelism between the board surface of the module board 410 and the fourth surface 342 decreases when the force is not sufficient. In contrast, by virtue of the wiring board 301 according to the second embodiment, by the protrusions 348 being present on the fourth surface 342, the adhesive material 388 spread on the bottom surface of the board-like section 304 becomes a thickness equivalent to the height of the protrusions 348, and it is possible to lessen the force for pressing the wiring board 301 against the module board 410. Furthermore, because the plurality of protrusions 348 give three-point support for the base body 302, by pressing the plurality of protrusions 348 against the board surface of the module board 410, it is possible to install the wiring board 301 by aligning the orientation of the wiring board 301 with the module board 410 with high accuracy.

Furthermore, by virtue of the wiring board 301 according to the second embodiment, there is the recess 331K which is positioned at the perimeter of the first surface 331. Because the area of the first surface 331 decreases in accordance with the recess 331K, it becomes easy to position the electronic component 381 which is mounted to the first surface 331. Furthermore, by the recess 331K being at the entire perimeter of the first surface 331, the weight balance of the wiring board 301 stabilizes, and it is possible to increase an effect of suppressing natural vibration of the wiring board 301 with respect to various vibration directions.

By virtue of the electronic device 380 and the electronic module 400 according to the second embodiment, by having the wiring board 301, it is easy to align with high accuracy the relative angles between the plurality of electronic components 381 to 383 and the module board 410. Furthermore, it is possible to suppress natural vibration from arising in the electronic device 380 even if an external force or an inertial force acts on the module board 410. Accordingly, it is possible to address improving performance and reducing costs for the electronic device 380 and the electronic module 400.

Description was given above regarding the second embodiment of the present disclosure. However, the present invention is not limited to the second embodiment described above. For example, in the second embodiment described above, description was given by taking as an example a configuration in which the polyhedron section 303 is a cube or a rectangular parallelepiped. However, in accordance with the number of electronic components to mount and the relative angles required for between the plurality of electronic components and the module board, a convex polyhedron shape having a number of surfaces that is not six and relative angles between respective surfaces that are not orthogonal may be employed. In addition, in the second embodiment described above, description was given for a configuration in which wiring conductors are disposed following the surface of the base body, but wiring conductors that pass through the inside of the base body may be included. In addition, details described in the second embodiment can be changed, as appropriate, in a range that does not deviate from the spirit of the invention.

INDUSTRIAL APPLICABILITY

The present disclosure can be used for a wiring board, an electronic device, and an electronic module.

REFERENCE SIGNS LIST

101 Wiring board
110 Base body
111 First surface
112 Second surface
113 Third surface
114 Fourth surface
114Ca to 114Cd Corner
114Da to 114Dd Corner
114Sa and 114Sb Edge
114Ta and 114Tb Edge
115 Fifth surface
116 Sixth surface
111K Recess (first recess)
114K Recess (second recess)
FL Side surface
S111$k$, S114$k$, S114$kb$ Sloped surface
121 to 124 Wiring conductor
EM Application section
Lc, Ls Distance between outline of fourth surface and outline of recess
160 Electronic device
161*a* to 161*c* Electronic component
167, 168 Adhesive material
169 Electrically conductive joining material
200 Electronic module
210 Module board
w Bonding wire
301 Wiring board
302 Base body
303 Polyhedron section
304 Board-like section
305 Thick section
331 First surface
331K Recess (third recess)
332 Second surface
333 Third surface
334 Fifth surface
335 Sixth surface
341 Extension
342 Fourth surface
345 Notch
348 Protrusion
361 to 364 Wiring conductor
380 Electronic device
381 to 383 Electronic component
387 and 388 Adhesive material
400 Electronic module
410 Module board
412 Wiring conductor
FL2 Side surface
CN Corner
SD Edge
w Bonding wire

The invention claimed is:

1. A wiring board, comprising:
a base body having insulating properties; and
a wiring conductor positioned on the base body, wherein the base body has a first surface, a fourth surface positioned opposite to the first surface, and a second surface and a third surface positioned at side surfaces between the first surface and the fourth surface,
the first surface, the second surface, and the third surface are mounting surfaces for respective electronic components, and
the fourth surface is an installation surface,
wherein:
the base body has a first recess at a perimeter of the fourth surface,
the wiring conductor is positioned from the side surfaces to the first recess, and
the first recess is positioned at the entire perimeter of the fourth surface.

2. The wiring board according to claim 1, wherein the first recess has a sloped surface that connects to the fourth surface.

3. A wiring board, comprising:
a base body having insulating properties; and
a wiring conductor positioned on the base body, wherein
the base body has a first surface, a fourth surface positioned opposite to the first surface, and a second surface and a third surface positioned at side surfaces between the first surface and the fourth surface,
the first surface, the second surface, and the third surface are mounting surfaces for respective electronic components, and
the fourth surface is an installation surface;
wherein:
the base body has a first recess at a perimeter of the fourth surface,
the wiring conductor is positioned from the side surfaces to the first recess;
the fourth surface, in a front view, has a first edge and a second edge, and a first corner that is positioned between the first edge and the second edge,
the first recess in the front view has a third edge that follows the first edge, a fourth edge that follows the second edge, and a second corner that is positioned between the third edge and the fourth edge, and
a distance between the first edge and the third edge and a distance between the second edge and the fourth edge are longer than a distance between the first corner and the second corner.

4. The wiring board according to claim 1, wherein the base body has a second recess at the perimeter of the first surface.

5. A wiring board, comprising:
a base body having insulating properties; and
a wiring conductor positioned on the base body, wherein
the base body has a first surface, a fourth surface positioned opposite to the first surface, and a second surface and a third surface positioned at side surfaces between the first surface and the fourth surface,
the first surface, the second surface, and the third surface are mounting surfaces for respective electronic components, and
the fourth surface is an installation surface;
wherein the base body includes, between the fourth surface and the side surfaces, an extension that juts outward from the side surfaces.

6. The wiring board according to claim 5, wherein the extension includes, at a portion close to the side surfaces, a thick section that is thicker than other portions of the extension.

7. The wiring board according to claim 6, wherein the extension is positioned over an entire area between the fourth surface and the side surfaces, and all of a portion of the extension that is close to the side surfaces is the thick section.

8. The wiring board according to claim 5, wherein the extension includes four corners and four edges that are included in an outline seen from a direction perpendicular to the first surface, and
a minimum distance from each of the four edges to a start of the extension is shorter than a minimum distance from each of the four corners to the start of the extension.

9. The wiring board according to claim 5, wherein a longest jutting length for the extension is greater than or equal to one quarter of a height of the base body.

10. The wiring board according to claim 5, wherein the extension has a notch at an edge on the first surface side.

11. The wiring board according to claim 5, wherein the fourth surface has protrusions for giving three-point support for the base body.

12. The wiring board according to claim 5, wherein the base body has a third recess positioned at a perimeter of the first surface.

13. An electronic device, comprising:
the wiring board according to claim 1; and
electronic components respectively mounted on the first surface, the second surface, and the third surface.

14. An electronic module, comprising:
the electronic device according to claim 13; and
a module board on which the electronic device is mounted.

15. An electronic module, comprising:
an electronic device that includes the wiring board according to claim 1 and electronic components respectively mounted to the first surface, the second surface, and the third surface; and
a module board on which the electronic device is mounted, wherein
an electrically conductive joining material is positioned extending from the module board to the side surfaces of the wiring board.

16. The electronic module according to claim 15, wherein the base body has a plurality of side surfaces, and each of the plurality of side surfaces has a section on which the electrically conductive joining material is applied.

* * * * *